PROCESS FOR EPITAXIALLY GROWING GALLIUM ARSENIDE ON GERMANIUM
Filed Jan. 3, 1967
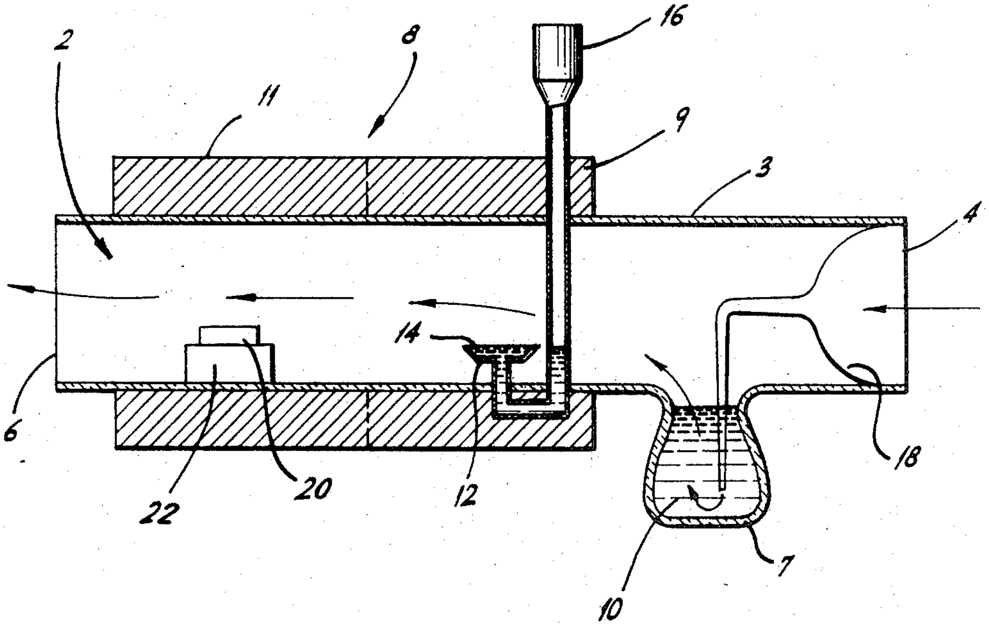
INVENTORS
HENRY HOLLOWAY
KENNETH H. MAXWELL
BY Leonard Zalman
ATTORNEY United States Patent Office 3,556,875

Patented Jan. 19, 1971

3,556,875

PROCESS FOR EPITAXIALLY GROWING GALLIUM ARSENIDE ON GERMANIUM

Henry Holloway, Orchid Lake, Mich., and Kenneth H. Maxwell, Palmyra, N.Y., assignors to Philco-Ford Corporation, Philadelphia, Pa., a corporation of Delaware Filed Jan. 3, 1967, Ser. No. 607,018

Int. Cl. H01l 7/34, 7/36

U.S. Cl. 148—175 4 Claims

ABSTRACT OF THE DISCLOSURE

A monocrystalline germanium substrate having an exposed surface oriented between the (100) and the (111) crystal planes, preferably at or between the (311) and (511) planes, is established at a temperature between 730° and 780° centigrade. While at this temperature the exposed germanium surface is subjected initially, for about two minutes, to a first vapor mixture of arsenic, hydrogen chloride and hydrogen (but no gallium metal or compound). This first mixture preferably is produced by reacting at about 900° C. arsenic trichloride vapor with hydrogen gas. Then the exposed germanium surface is subjected to a second vapor mixture of arsenic, gallium chloride, hydrogen chloride and hydrogen. This second mixture preferably is produced by reacting at about 900° C. arsenic trichloride vapor, the vapor of gallium saturated with arsenic prior to vaporization, and hydrogen. Under such conditions, monocrystalline gallium arsenide having sufficiently high crystalline perfection for use in semiconductor devices epitaxes onto the exposed surface of the germanium substrate.

Experiments have shown that gallium arsenide has both a high energy gap and a high electron mobility. These properties make gallium arsenide a likely material for use in high frequency and high temperature devices. These properties also make gallium arsenide devices more resistant than germanium and silicon devices to the deteriorating effects of electron and proton bombardment. This resistance to the effects of electron and proton bombardment suggests that gallium arsenide devices, such as solar batteries, can be used in earth satellites which spend an appreciable time in the earth's radiation belts.

While gallium arsenide is a suitable material for use in the aforementioned categories of devices, utilization of gallium arsenide devices has been restricted by their high cost. The high cost is due, largely, to the fact that good quality, single bulk crystal gallium arsenide is expensive. Consequently, there has been much interest in using epitaxial crystal processes to grow thin layers of gallium arsenide on suitable substrates.

Single crystal germanium is an obvious choice as a substrate for the epitaxial growth of gallium arsenide, principally because of the very small lattice mismatch between the two materials and the closeness of their coefficients of thermal expansion. Various methods have been proposed by the prior art to achieve epitaxial growth of gallium arsenide on germanium substrates. However, these methods have failed to produce epitaxial layers of gallium arsenide that have properties equivalent to those of good-quality bulk gallium arsenide.

Accordingly, it is an object of the present invention to provide a method for the epitaxial growth of device quality gallium arsenide.

Another object of the present invention is to provide a method for the epitaxial growth of device quality gallium arsenide on a germanium substrate.

In accordance with the present invention, we have found that the epitaxial growth of device quality gallium arsenide on a germanium substrate can be achieved if three essential conditions of the substrate are maintained. The essential conditions are: (1) that the temperature of the substrate be within the range of 730° to 780° C.; (2) that the epitaxial growth be from the vapor phase and initiated in the presence of an excess of arsenic vapor; and (3) that the substrate be oriented between the (100) and (111) crystal planes.

For a better understanding of the present invention together with other and further objects thereof reference should now be had to the following detailed description which is to be read in conjunction with the accompanying drawing which is a schematic representation of an apparatus suitable for the practice of the present invention.

Referring to the drawing, the apparatus includes a reaction chamber 2 formed of an open-ended tube 3 having an inlet port 4, an outlet port 6, and a reservoir 7. By way of example, tube 3 can be a quartz tube having a one inch outside diameter. Reservoir 7 contains a solution 10 which serves as a source of arsenic for the epitaxial layer to be formed. In accordance with the present invention the solution 10 can be arsenic trichloride. Surrounding a portion of the tube 3 is a furnace 8 having two temperature zones; one zone 9 maintains a portion of the reaction chamber 2 at a temperature of approximately 900° C. and the other zone 11 maintains an adjacent portion of the reaction chamber 2 at a temperature within the range of 730 to 780° C.

A boat-shaped crucible 12, suitably one made of vitreous silica material, is contained within the portion of the reaction chamber 2 that is maintained at approximately 900° C. The crucible 12 contains gallium 14 which can be fed continuously into the crucible 12 from a reservoir 16.

A supply line 18 is provided at the inlet port 4 of the tube 3 for admitting a gaseous reactant into the solution 10. The gaseous reactant, suitably hydrogen, serves as a carrier for transporting vapors of the solution 10 toward the outlet port 6 of the tube 3.

A substrate 20, suitably germanium, is positioned on a support 22 located in the portion of the reaction chamber 2 maintained within the temperature range of 730° to 780° C. The relatively cool substrate 20 provides a site within the reaction chamber 2 at which the growth of gallium arsenide can occur.

As will be explained in detail presently, it is essential for the epitaxial growth of bulk quality gallium arsenide that the exposed surface of substrate 20 have a specific crystal orientation. More particularly, it is essential that the crystal orientation of the substrate 20 be between the (111) and (100) crystal planes, preferably at or between the (311) and (511) crystal planes.

It is also essential that the substrate 20 be exposed to critically controlled environmental conditions. That is, the substrate 20 must be maintained between the temperature range of 730° to 780° C. and epitaxial crystal growth upon the surface of substrate 20 must be initiated in an atmosphere which contains an excess of arsenic vapor.

In a typical reaction sequence using the apparatus of the drawing to produce bulk quality epitaxially grown gallium arsenide crystals, impurity free hydrogen is forced through the supply line 18 and bubbled through an arsenic trichloride solution 10 at the rate of approximately 300 cubic centimeters per minute. The hydrogen can be freed of gaseous impurities by passing the hydrogen successively through a catalytic purifier and a trap cooled in liquid nitrogen. Similarly, the arsenic trichloride solution 10 should be freed from dissolved gaseous impurities prior to being used in the apparatus. This can be achieved by alternate freezing and melting the solution in vacuo; after which hydrogen is bubbled through the solution at the rate of 100 cubic centimeters per minute for approximately one hour.

Bubbling the hydrogen through the arsenic trichloride solution 10 produces a mixture of hydrogen and arsenic trichloride vapors. This vapor mixture is forced toward the outlet port 6 of tube 3. Upon exposure to the high temperature portions of the reaction chamber 2, the arsenic trichloride vapor is almost completely chemically reduced by the hydrogen gas. This reaction produces a mixture of hydrogen chloride, arsenic, and hydrogen gases.

The mixture of hydrogen chloride, arsenic, and hydrogen gases flows toward the outlet port 6 of the tube 3. The flow rate of this mixture of gases in a tubular reaction chamber having a one inch outside diameter should be between 200 and 400 cubic centimeters per minute. A flow rate lower than 200 cubic centimeters per minute in a reaction chamber having the size mentioned produces poor epitaxial layers while a flow rate in excess of 400 cubic centimeters per minute in such a reaction chamber diminishes the growth rate of the epitaxial layers and, eventually, produces net etching of the surface of the substrate 20. The flow rate of the mixture of gases can be controlled by varying the flow rate of the hydrogen forced through the supply line 18.

As soon as traces of arsenic appear at the outlet port 6 of the reaction chamber 2, the germanium substrate 20 is inserted into the reaction chamber 2 and placed upon the support 22. Since, as previously stated, arsenic trichloride is almost completely reduced by hydrogen at the operating temperatures of the reaction chamber 2 and the gallium 14 has not as yet been fed into the crucible 12, the substrate 20 sees a mixture of hydrogen, hydrogen chloride and arsenic gases before is it exposed to gallium. While the reaction between the mixture of gases and the substrate 20 is not fully understood, it is believed that the hydrogen chloride cleans the surface of the substrate 20 and that the presence of the arsenic results in the initial formation of a thin layer of liquid germanium/arsenic alloy on the surface of substrate 20. When gallium vapor is brought into contact with the liquid, we believe that equitaxial growth of gallium arsenide starts through the liquid. However, the invention is not to be limited by this explanation.

We have found that below the temperature of 730° C. poor quality crystals containing many low-angle grain boundaries are produced. The low-angle grain boundaries provide paths for the anomalously rapid diffusion of dopants and hence make the crystals unsuitable for the fabrication of junction devices. Crystals with similar imperfections are produced when the temperature of the substrate 20 exceeds 780° C. The highest quality crystal layers are grown at 760° C.

As previously stated, we have found that the epitaxial growth of good-quality gallium arsenide crystals on a germanium substrate requires that the exposed substrate surface have the proper crystal orientation. Prior art methods hav attempted to grow gallium arsenide on the (100), (111) and (110) crystal planes of a germanium substrate. Crystals grown upon these crystal planes have not been of device quality. We have found that device quality epitaxial crystal layers can be produced upon germanium substrates oriented intermediate the (111) and the (100) crystal planes and that optimum growth of gallium arsenide crystals is achieved using the germanium (311) and (511) crystal planes.

Returning to the reaction sequence, the substrate 20 with the properly oriented crystal face is exposed to the gas stream produced by the chemical reaction of hydrogen and arsenic trichloride for approximately two minutes before the gallium 14 is inserted into the crucible 12. It is necessary that the gallium 14 be saturated with arsenic before inserting it into the crucible 12. Otherwise, the arsenic gas will not transport down the reaction chamber 2 but will merely dissolve in the gallium 14.

The temperature of the portion of the reaction chamber 2 surrounded by zone 9 of the furnace 8 is sufficiently high to vaporize the gallium 14. Th gallium vapor reacts with the other gases present in the reaction chamber 2 and this reaction results in the formation of a gaseous chloride of gallium which flows toward the outlet port 6 of the tube 3 and hence toward the substrate 20. At the substrate 20, an exothermic reaction occurs with the synthesis of gallium arsenide as a product thereof.

Gallium arsenide crystal films grown upon germanium substrates in accordance with the present invention are of good quality both metallurgically and electrically and junction diodes having characteristics approaching those formed in good-quality bulk crystals can be fabricated in the films by conventional diffusion processes. This makes the production of gallium arsenide devices economically feasible.

While the invention has been described with reference to the above-described apparatus, it will be apparent that the invention can be practiced in apparatus differing from that specifically illustrated, as will be apparent to those skilled in the art from knowledge of the principles and steps herein taught. Accordingly, we desire the scope of our invention to be limited only by the appended claims.

We claim:

1. A process for growing an epitaxial film of gallium arsenide on a germanium substrate, comprising:

establishing at a temperature between 730 degrees centigrade and 780 degrees centigrade a germanium substrate having an exposed monocrystalline surface lying between but not in either of the (100) and (111) planes of said substrate, and, while said substrate is maintained at said temperature, flowing over said surface for at least about two minutes a gallium-free first vapor mixture of arsenic, hydrogen chloride and hydrogen, produced by reacting arsenic trichloride vapor with hydrogen gas, and then flowing over said surface a second vapor mixture of arsenic, gallium chloride, hydrogen chloride and hydrogen, produced by reacting arsenic trichloride vapor, hydrogen gas, and a vapor of gallium metal saturated with arsenic prior to vaporization of said gallium metal, the flow rate of each of said first and second vapor mixtures over said germanium surface being equivalent to a flow of between 200 and 400 cubic centimeters per minute through a cylindrical tube of about one inch diameter, and the flow of said second mixture being continued for a time sufficient to grow said epitaxial film.

2. A process according to claim 1, wherein said exposed surface of said germanium substrate lies in a plane oriented between (311) and (511) inclusive.

3. A process according to claim 1, wherein said first vapor mixture is produced by bubbling hydrogen gas through a solution of arsenic trichloride, thereby to produce a third vapor mixture of hydrogen and arsenic trichloride, and heating said third vapor mixture to a temperature of approximately 900 degrees centigrade, and said second vapor mixture is produced by heating said third vapor mixture and said vapor of arsenic-saturated gallium metal to a temperature of approximately 900° C.

4. A process according to claim 3, wherein said exposed surface of said germanium substrate lies in a plane oriented between (311) and (511) inclusive and said substrate is maintained at a temperature of about 760 degrees centigrade.

References Cited

UNITED STATES PATENTS

| | | | |
|---|---|---|---|
| 3,299,330 | 1/1967 | Watanabe et al. | 148—175XR |
| 3,312,570 | 4/1967 | Ruehrwein | 148—175 |
| 3,325,314 | 6/1967 | Allegretti | 148—175 |
| 3,379,584 | 4/1968 | Bean et al. | 117—106XR |
| 3,393,103 | 7/1968 | Hellbardt et al. | 148—174XR |
| 3,392,069 | 7/1968 | Merkel et al. | 148—175XR |

OTHER REFERENCES

Weinstein et al.: "Preparation and Properties of GaAs–GaP, GaAs–Ge, and GaP–Ge Heterojunctions," J. Electrochemical Soc., vol. III, No. 6, pp. 674–682 (1964).

Gabor, T.: "Epitaxial Growth of Gallium Arsenide on Germanium Substrates" Parts I, II, and III, J. Electrochemical Soc. vol. III, No. 7, pp. 817–827 (1964).

Sangster, R.C.: "Model Studies of Crystal Growth Phenomena in the III–V Semiconducting Compounds," in "Compound Semiconductors," Willardson & Goering, Eds. (Reinhold Pupl. Corp., N.Y. 1962), vol. I, pp. 241–253.

L. DEWAYNE RUTLEDGE, Primary Examiner

W. G. SABA, Assistant Examiner

U.S. Cl. X.R.

117—106, 201; 148—174; 252—62.3